United States Patent
Blasi et al.

[11] Patent Number: 5,973,928
[45] Date of Patent: Oct. 26, 1999

[54] MULTI-LAYER CERAMIC SUBSTRATE DECOUPLING

[75] Inventors: Charles J. Blasi, Highland; Gobinda Das; Franco Motika, both of Hopewell Junction, all of N.Y.

[73] Assignee: International Business Machines Corporation, Armonk, N.Y.

[21] Appl. No.: 09/135,663

[22] Filed: Aug. 18, 1998

[51] Int. Cl.⁶ .................................................... H05K 7/02
[52] U.S. Cl. ........................ 361/760; 361/761; 361/803; 361/763; 361/764; 439/66; 439/65; 257/774; 257/700; 257/692; 174/261; 174/250; 174/256; 174/260; 228/180.12; 228/116
[58] Field of Search ..................................... 361/760, 761, 361/803, 785, 794, 629, 212, 763, 764; 257/666, 692–696, 758, 209, 211, 700, 724, 697, 774; 439/66, 65; 174/261, 250, 35 R, 260, 256, 52.4; 228/180.21, 116

[56] References Cited

U.S. PATENT DOCUMENTS

| | | | |
|---|---|---|---|
| 4,322,778 | 3/1982 | Barbour et al. | 361/794 |
| 4,349,862 | 9/1982 | Bajorek et al. | 361/762 |
| 4,734,819 | 3/1988 | Hernandez et al. | 361/306 |
| 4,748,537 | 5/1988 | Hernandez et al. | 361/406 |
| 4,860,165 | 8/1989 | Cassinelli | 361/710 |
| 5,184,285 | 2/1993 | Murphy et al. | 361/421 |
| 5,272,590 | 12/1993 | Hernandez | 361/306.2 |
| 5,479,319 | 12/1995 | Werther | 361/784 |
| 5,596,224 | 1/1997 | Murphy et al. | 257/666 |
| 5,694,297 | 12/1997 | Smith et al. | 361/785 |
| 5,832,294 | 11/1998 | Reinschmidt | 395/800.32 |

OTHER PUBLICATIONS

IBM Technical Disclosure Magdo, S. Low Inductance Module, Oct. 1978 vol. 21 No. 5.
IBM Technical Disclosure Hansen et al. Circuit Module with Bottom–Mounted Decoupling Capacitors, Mar. 1985 vol. 27No. 10A.

*Primary Examiner*—Leo P. Picard
*Assistant Examiner*—David Foster
*Attorney, Agent, or Firm*—McGinn & Gibb, P.C.; Daryl K. Neff, Esq.

[57] ABSTRACT

A multi-layer ceramic module comprises a multi-layer ceramic substrate having an upper side and a lower side, at least one semiconductor chip mounted on the upper side of the substrate, a plurality of module pins projecting from the lower side of the substrate and at least one decoupling capacitor mounted on the lower side of the substrate between adjacent ones of the module pins.

27 Claims, 4 Drawing Sheets

MULTI-LAYER CERAMIC SUBSTRATE DECOUPLING

BACKGROUND OF THE INVENTION

1. Field of the Invention

The present invention generally relates to a multi-layer ceramic module which utilizes discrete components such as decoupling capacitors and more specifically to an improved structure which reduces inductance effects associated with decoupling capacitors and which increases the effectiveness of decoupling capacitors.

2. Description of the Related Art

Advances in very large scale integration (VLSI) technology and increases in integration densities have caused numerous problems with multi-layer ceramic modules which utilize external discrete components in close proximity to the chip. As the size of the die or chip increased from a few millimeters to tens of millimeters, the on chip and off chip power distribution problem requires better power supply decoupling. The problem is somewhat relieved, especially for high frequencies, by on chip decoupling. However, for intermediate and low frequency decoupling one still needs to provide external decoupling capacitors as close as possible to the chip.

The conventional method of decoupling a module, or Temporary Chip Attach (TCA) substrate, is shown in FIG. 1. The decoupling capacitors 10 are typically placed on the top surface 11 of the MLC substrate 12 surrounding the chip 13 and are connected to internal MLC power and ground distribution planes. This method was conventionally adequate when the chips were relatively small in size and required low power, but with present day chips the distance from the edge of the chip to the center of the chip introduces significant distributed inductance which makes external decoupling highly ineffective.

In addition to power decoupling, it is often required to add external components to the MLC package in close proximity to the chip input/output. Such external components may consist of discrete passive RLCs or active chiplets with analog or digital functions. These external components are typically difficult to integrate in the integrated circuit and require low inductance, resistance, and cross coupling paths to the chip.

Furthermore, MLC substrates are often used as space transformers in state-of-the-art VLSI wafer test systems. The substrate is used in a "reverse" manner such that the pins of the module substrate interface with the test system's pin electronics test head, while the chip is replaced with the wafer contacting probe. One of the new probing approaches is to use Thin Film Interface (TFI) probes or membrane probes. However, a problem occurs because physically adapting these TFI probes to a MLC space transformer with decoupling capacitors on the periphery of the target area becomes somewhat difficult and costly.

The general problem of module package power supply decoupling is a well known problem and has been address before with a variety of configurations for different packages. However, none of the conventional solutions specifically address the problems of increasing chip size and TFI interfacing, described above.

SUMMARY OF THE INVENTION

The present invention generally relates to a solution to two problems encountered with the placement of decoupling capacitors on Multi-layer Ceramic (MLC) substrates used in module packaging. The first problem solved by the invention is that of excessive inductance due to the physical distance from the decoupling capacitor to the chip. The second problem resolved is the physical interference of the decoupling capacitor when the MLC substrate is used as a probe space transformer in wafer test contacting.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF A PREFERRED EMBODIMENT OF THE INVENTION

Figure 2A:
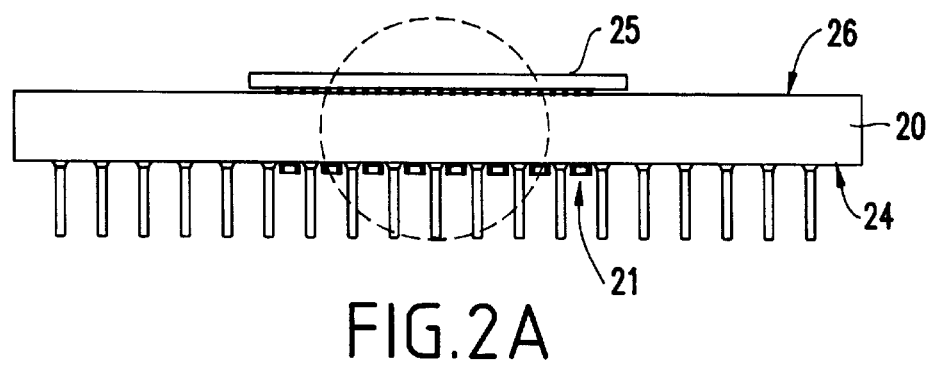
FIGS. 2A–2B are schematic diagrams of a MLC module having bottom mounted decoupling capacitors according to the invention.
Figure 2B:
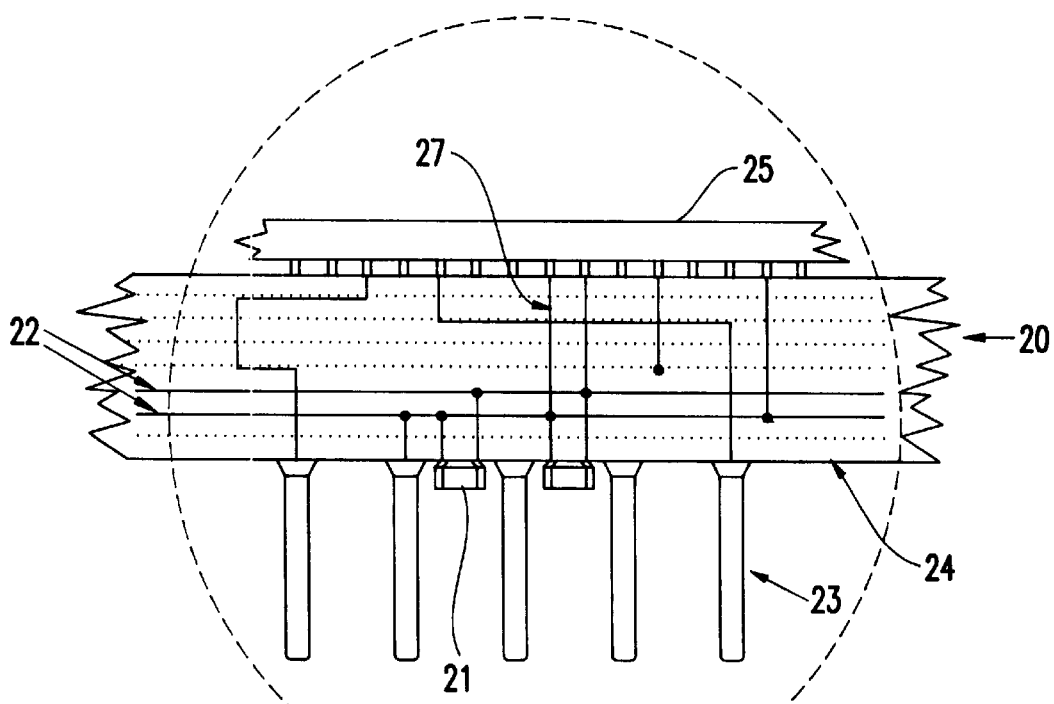

Referring now to the drawings, and more particularly to FIGS. 2A–2B, The solution to both of the problems mentioned above can be achieved by restructuring the MLC substrate 20 such that the capacitors 21 (preferably decoupling capacitors) can be attached to the bottom surface 24 of the substrate 20 opposite the chip 25 and positioned between the module pins 23. This frees up the top surface 26 and at the same time provides a much closer and higher quality decoupling to the chip 25.

The enlarged view shown in FIG. 2B illustrates an array of decoupling chip-capacitors 21 placed between the module pins 23 and distributed throughout the bottom surface 24 of the TCA 20 in order to optimize the distributed power demand from very large chips. This can be even further improved by designing the internal MLC power distribution 22 to insure the shortest distance between the capacitor and the decoupling chip-capacitors 21.

And as illustrated in FIG. 2B, the decoupling capacitors 21 are not wired into the module pins 23, but instead are directly wired into the power and ground planes 22 and are placed between the module pins 23 (e.g., interstitially). The decoupling capacitors 21 may be electrically connected to the pins only indirectly through the wiring within the substrate. However, the decoupling capacitors 21 are preferably not externally connected to the module pins 23.

The decoupling capacitors 21 are preferably wired directly to the chip 25 by way of vertical vias 27 through the MLC substrate 20. This structure permits a shortest possible distance to exist between the chip 25 and the decoupling capacitors 21, which decreases undesirable inductance effects and produces a better decoupling effect.

Figure 1:
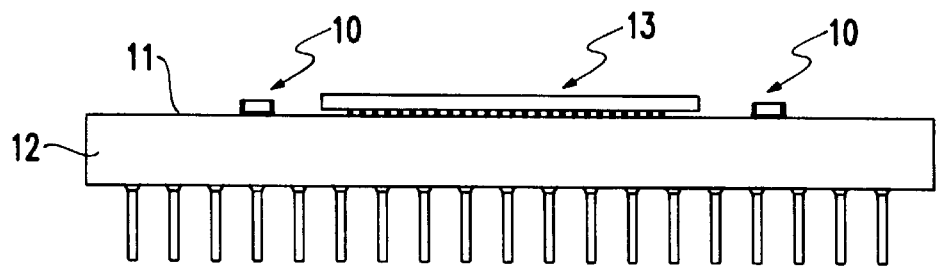
FIG. 1 is a cross sectional view of a substrate with decoupling capacitors.

As mentioned above, with present day chips the distance from the edge of the chip to the center of the chip introduces significant distributed inductance which makes external decoupling highly ineffective. In other words, the conventional structures, such as the structure illustrated in FIG. 1, have the decoupling capacitors 10 around the periphery of the chip 13 which further increases the distance between the decoupling capacitors 10 and the center of the chip 13. This increase in distance increases inductance and makes the decoupling capacitor less effective.

The invention overcomes this conventional problem by placing the decoupling capacitors 21 a short distance from the chip 25 (e.g., merely a distance equal to the thickness of the MLC substrate).

Figure 3B:
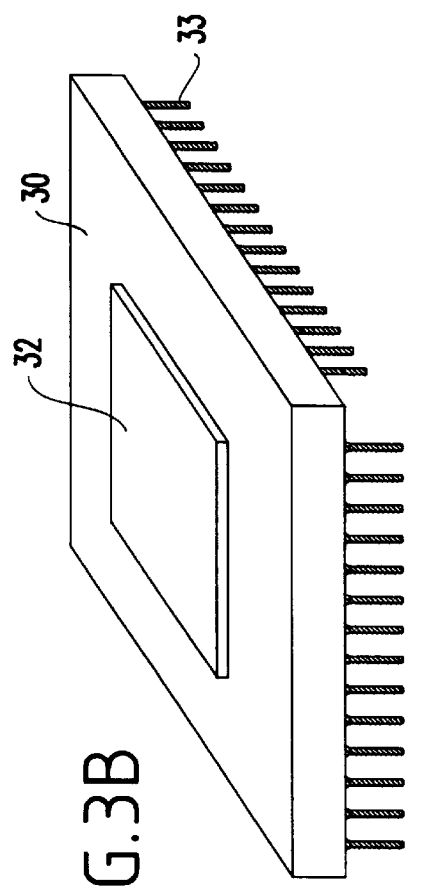
FIG. 3A–3C are schematic diagrams of a MLC module having bottom mounted decoupling capacitors according to the invention.
Figure 3C:
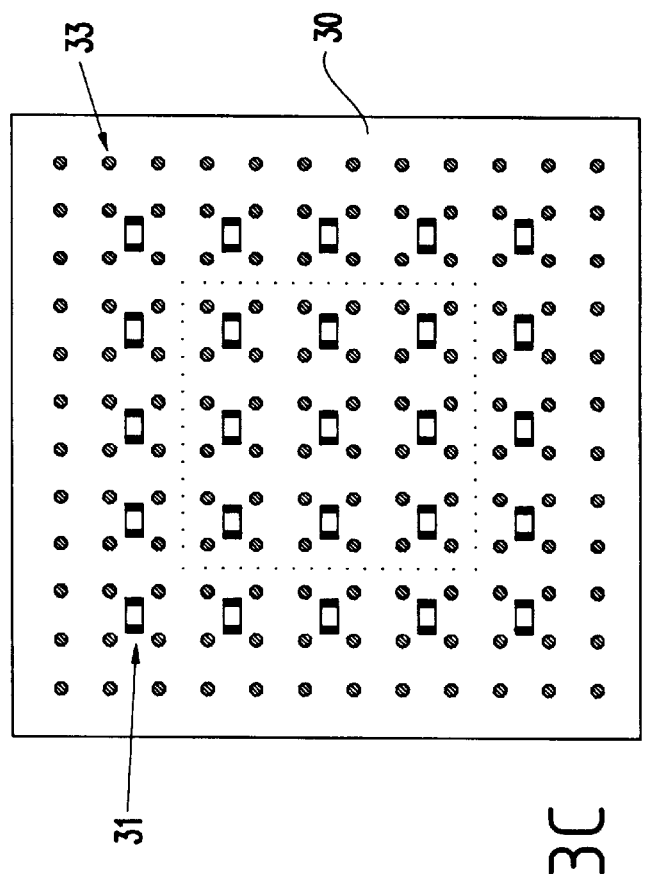
Figure 3A:
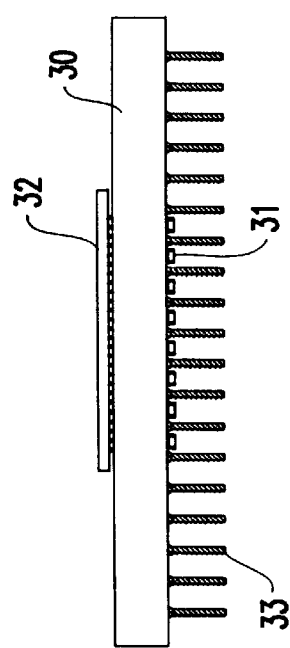

FIGS. 3A–3C illustrate different views of the same structure discussed above. More specifically FIGS. 3A–3C illustrate a MLC substrate 30, decoupling capacitors 31, a chip 32 and an array of module pins 33. FIG. 3A illustrates a side view, FIG. 3B illustrates a perspective view and FIG. 3C illustrates a bottom view of the inventive structure.

Figure 4:
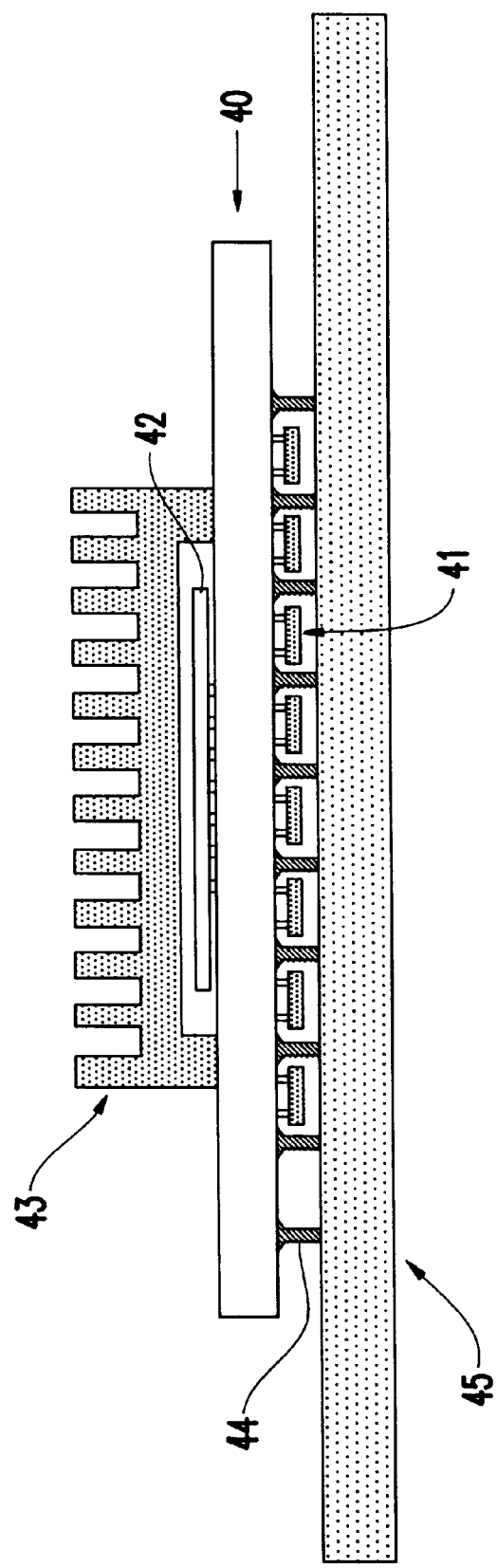
FIG. 4 is a schematic diagram of a MLC module having bottom mounted decoupling capacitors, a heat sink and a printed circuit board according to the invention.

FIG. 4 illustrates an embodiment of the invention which includes a heat sink 43 and a printed circuit board 45. More specifically, FIG. 4 illustrates a MLC substrate 40, chip capacitors 41, a chip 42, a heat sink 43 and module pins 44 which connect the MLC substrate 40, to a printed circuit board 45.

Figure 5:
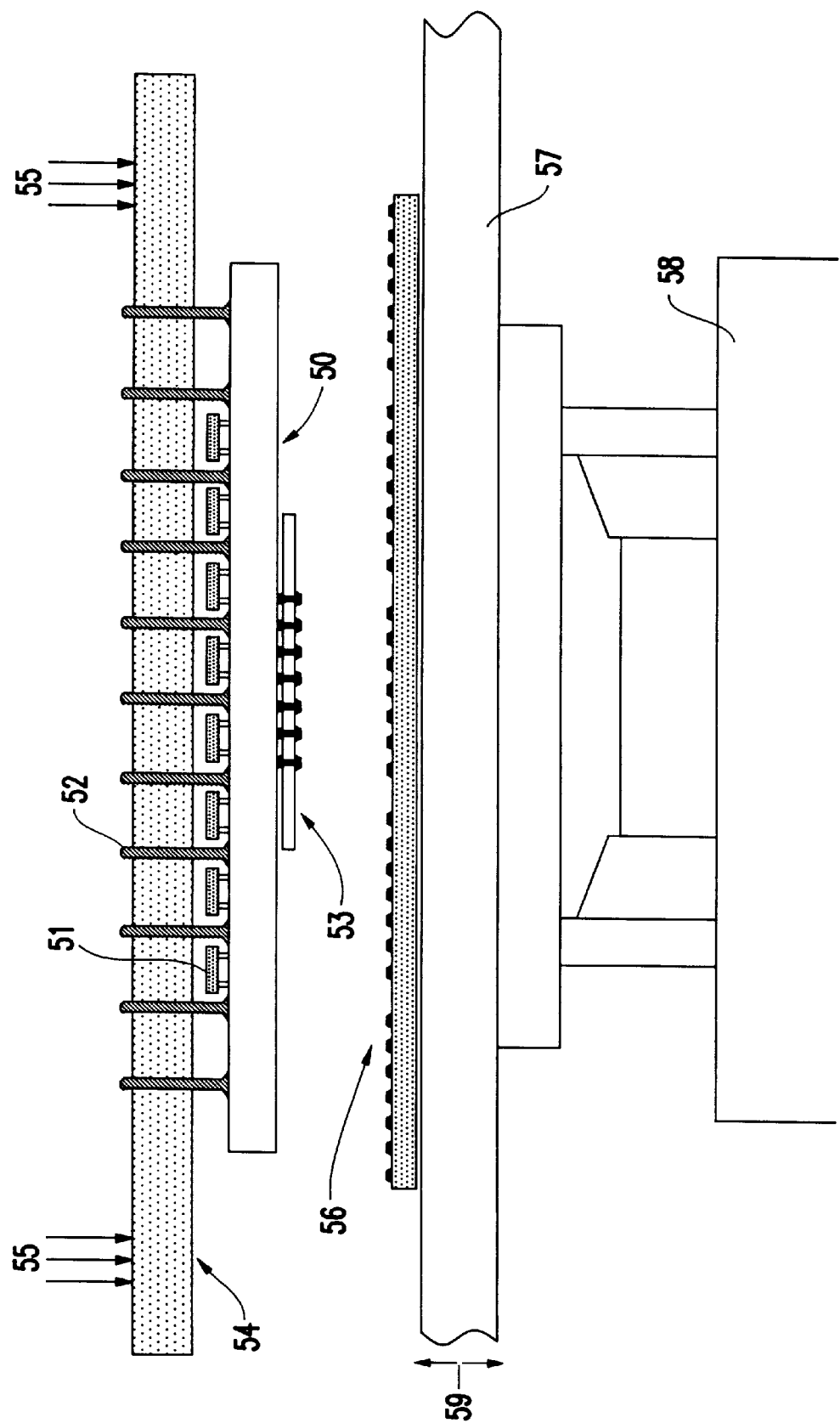
FIG. 5 illustrates a MLC space transformer decoupling for a TFI probe configuration.

With the decoupling chip-capacitors removed from the top surface of the MLC substrate, it is substantially easier to interface any type of wafer probe when the MLC substrate is used as a space transformer as shown in FIG. 5. This is especially desirable when working with TFI probes that require an unrestricted flat surface around the target area. Similarly, this is also convenient when a heat sink is required for the package.

For example, as illustrated in FIG. 5, the inventive structure preferably includes a MLC substrate 50, which in this case comprises a space transformer, decoupling capacitors 51, module pins 52, a TFI probe 53, a tester interface/test head interface board 54, which is contacted by tester signals and power probes 55. A device under test 56, a thermal wafer chuck 57 and a wafer handler 58, which can be moved up and down as shown in arrows 59.

In the conventional space transformer structure, and additional spacer chiplet is required between the TFI probe and the contact area, to clear the TFI from interfering with the decoupling capacitors surrounding the contact area. This additional interface introduces signal and power path degradation, reliability concerns, and additional cost.

In addition to the two problems addressed above, the inventive structure has the additional benefit of making the rework of the TCA simpler. The rework of the TCA consists of a thermal and mechanical process for removing the chip from the surface of the MLC. Decoupling capacitors or other components in close proximity to the periphery of the chip make this process more difficult and alter results in the accidental removal or damage of the capacitors.

Therefore, the invention is highly desirable for TCA substrates that are reused multiple times for test and burn-in purposes.

When the TCA substrate is used as a chip carrier for Physical Failure Analysis (PFA) and diagnostic evaluation, the absence of the decoupling caps on the top surface allow for easy polishing of the chip when chip backside analysis is required. This makes mechanical polishing of the chip possible without interfering with the chip power decoupling and distribution.

Some of the potential benefits that are realized with this invention are improved high frequency decoupling; adaptability to larger chip sizes; simplified TFI space transformer structure; increased ease to rework the module or TCA; unrestricted heat sink placement; and convenient chip backside polishing for diagnostics. Further, the different environments that the invention is useful in includes wide range of discrete components, analog/digital active and passive functions, phase lock loop (PLL) low power filtering, crystal oscillator support, off chip termination and multi chip module adhesives.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A multi-layer ceramic module comprising:
   a multi-layer ceramic substrate having an upper side and a lower side;
   at least one semiconductor chip mounted on said upper side of said substrate;
   a plurality of module pins projecting from said lower side of said substrate; and
   at least one capacitor mounted on said lower side of said substrate between adjacent ones of said module pins.

2. The multi-layer ceramic module in claim 1, wherein said multi-layer ceramic substrate includes a power/ground grid and said at least one capacitor is electrically connected to said semiconductor chip by said power/ground grid.

3. The multi-layer ceramic module in claim 1, wherein said multi-layer ceramic substrate includes vias and said at least one capacitor is electrically connected to said semiconductor chip by said vias.

4. The multi-layer ceramic module in claim 1, wherein a distance between said at least one capacitor and said semiconductor chip is approximately equal to a thickness of said multi-layer ceramic substrate.

5. The multi-layer ceramic module in claim 1, wherein said at least one capacitor comprises a plurality of capacitors placed interstitially with said module pins.

6. The multi-layer ceramic module in claim 1, wherein said at least one capacitor comprises at least one decoupling capacitor.

7. The multi-layer ceramic module in claim 1, wherein said at least one capacitor comprises a discrete component from said substrate.

8. The multi-layer ceramic module in claim 1, wherein said at least one capacitor is electrically separate from adjacent ones of said module pins.

9. The multi-layer ceramic module in claim 1, wherein said at least one capacitor is devoid of an exterior connection to said module pins.

10. The multi-layer ceramic module in claim 1, wherein said module pins comprise an array of module pins.

11. A testing apparatus for testing at least one wafer, said apparatus comprising:
    a multi-layer ceramic substrate having an upper side and a lower side;
    a plurality of module pins projecting from said upper side of said substrate;
    at least one capacitor mounted on said upper side of said substrate between adjacent ones of said module pins; and
    at least one probe mounted on said lower side of said substrate for contacting said wafer.

12. The testing apparatus in claim 11, wherein said multi-layer ceramic substrate comprises a space transformer.

13. The testing apparatus in claim 11, further comprising:
    a test head interface board connected to said module pins, said test head interface board moving said probe with respect to said wafer;

a thermal wafer chuck holding said wafer; and a wafer handler supporting said thermal wafer chuck.

14. The testing apparatus in claim 11, wherein said probe comprises a thin film interface probe.

15. The testing apparatus in claim 11, wherein said multi-layer ceramic substrate includes a power/ground grid and said at least one capacitor is electrically connected to said at least one probe by said power/ground grid.

16. The testing apparatus in claim 11, wherein said multi-layer ceramic substrate includes vias and said at least one capacitor is electrically connected to said at least one probe by said vias.

17. The testing apparatus in claim 11, wherein a distance between said at least one capacitor and said at least one probe is approximately equal to a thickness of said multi-layer ceramic substrate.

18. The testing apparatus in claim 11, wherein said at least one capacitor comprises a plurality of capacitors placed interstitially with said module pins.

19. The testing apparatus in claim 11, wherein said at least one capacitor comprises at least one decoupling capacitor.

20. The testing apparatus in claim 11, wherein said at least one capacitor comprises a discrete component from said substrate.

21. The testing apparatus in claim 11, wherein said at least one capacitor is electrically separate from adjacent ones of said module pins.

22. The testing apparatus in claim 11, wherein said at least one capacitor is devoid of an exterior connection to said module pins.

23. The testing apparatus in claim 11, wherein said module pins comprise an array of module pins.

24. A multi-layer ceramic module comprising:

a multi-layer ceramic substrate having an upper side, a lower side and vias;

at least one semiconductor chip mounted on said upper side of said substrate;

a plurality of module pins projecting from said lower side of said substrate; and at least one capacitor mounted on said lower side of said substrate between adjacent ones of said module pins, said at least one capacitor comprising a discrete component from said substrate, said at least one capacitor being electrically connected to said semiconductor chip by said vias, and said at least one capacitor being devoid of an exterior connection to said module pins.

25. The multi-layer ceramic module in claim 24, wherein said at least one capacitor is electrically separate from adjacent ones of said module pins.

26. A testing apparatus for testing at least one wafer, said apparatus comprising:

a multi-layer ceramic substrate having an upper side, a lower side and vias;

a plurality of module pins projecting from said upper side of said substrate;

at least one capacitor mounted on said upper side of said substrate between adjacent ones of said module pins; and at least one probe mounted on said lower side of said substrate for contacting said wafer, said at least one capacitor comprising a discrete component from said substrate, said at least one capacitor being electrically connected to said semiconductor chip by said vias, and said at least one capacitor being devoid of an exterior connection to said module pins.

27. The testing apparatus in claim 26, wherein said at least one capacitor is electrically separate from adjacent ones of said module pins.

* * * * *